(12) United States Patent
Zhang et al.

(10) Patent No.: US 11,075,309 B2
(45) Date of Patent: Jul. 27, 2021

(54) SINTERABLE COMPOSITION FOR USE IN SOLAR PHOTOVOLTAIC CELLS

(71) Applicant: HENKEL AG & CO. KGAA, Duesseldorf (DE)

(72) Inventors: Chao Zhang, Shanghai (CN); Qili Wu, Shanghai (CN); Anja Henckens, Zonhoven (BE); Rudolf Oldenzijl, Hoogezand (NL); Liesbeth Theunissen, Wilsele (BE); Gunther Dreezen, Balen-Olmen (BE); Bart Van Remoortere, Valkenswaar (NL); Jing Yang, Shanghai (CN)

( * ) Notice: Subject to any disclaimer, the term of this patent is extended or adjusted under 35 U.S.C. 154(b) by 311 days.

(21) Appl. No.: 15/896,418

(22) Filed: Feb. 14, 2018

(65) Prior Publication Data
US 2018/0182907 A1 Jun. 28, 2018

Related U.S. Application Data

(63) Continuation of application No. PCT/CN2015/086988, filed on Aug. 14, 2015.

(51) Int. Cl.
| | | |
|---|---|---|
| *H01L 31/0224* | (2006.01) | |
| *H01B 1/22* | (2006.01) | |
| *H01L 31/02* | (2006.01) | |
| *H01L 31/18* | (2006.01) | |
| *H05K 3/32* | (2006.01) | |
| *H01L 31/072* | (2012.01) | |

(52) U.S. Cl.
CPC ....... *H01L 31/022466* (2013.01); *H01B 1/22* (2013.01); *H01L 31/0201* (2013.01);
(Continued)

(58) Field of Classification Search
CPC ..... H01L 21/4867; H01L 24/83; H01L 24/29; H01L 2224/83439; H01L 2224/32227;
(Continued)

(56) References Cited

U.S. PATENT DOCUMENTS

| | | |
|---|---|---|
| 8,188,365 B2 | 5/2012 | Kwag et al. |
| 2013/0312825 A1 | 11/2013 | Takahashi |

(Continued)

FOREIGN PATENT DOCUMENTS

| | | |
|---|---|---|
| CN | 1988182 A | 6/2007 |
| CN | 102754223 A | 10/2012 |

(Continued)

OTHER PUBLICATIONS

Sun, S. and Xia, Y. Shape-controlled synthesis of gold and silver nanoparticles. Science, vol. 298, Dec. 13, 2002, pp. 2176-2179.
(Continued)

*Primary Examiner* — Mohammed R Alam
(74) *Attorney, Agent, or Firm* — Steven C. Bauman

(57) ABSTRACT

The present invention relates to a conductive paste composition for solar photovoltaic cells comprising metal particles dispersed in a suitable carrier therefor, wherein said carrier comprises a solvent and a resin, and wherein at least a portion of said metal particles are characterized by having a ψ value, as defined by X-ray diffraction<0.0020, having at least 50% degree of crystallinity, and being anisotropic with respect to crystallographic direction.

16 Claims, 2 Drawing Sheets

(52) U.S. Cl.
CPC .. *H01L 31/022425* (2013.01); *H01L 31/1884* (2013.01); *H01L 31/072* (2013.01); *H05K 3/323* (2013.01); *H05K 2203/1131* (2013.01); *Y02E 10/50* (2013.01)

(58) Field of Classification Search
CPC . H01L 2224/05639; H01L 2224/04026; H01L 24/32; H05K 3/1283; H05K 2203/1131; H05K 3/1241; H05K 1/092; H05K 2201/0224; C23C 18/1295; C23C 18/08; C23C 18/127; B23K 35/025; B23K 35/3613; B23K 35/3006; B23K 1/0016; B22F 1/0062
See application file for complete search history.

(56) References Cited

U.S. PATENT DOCUMENTS

| | | | |
|---|---|---|---|
| 2014/0264887 A1* | 9/2014 | Barmak Vaziri | H01L 23/53257 257/770 |
| 2015/0104625 A1 | 4/2015 | Shiozawa | |
| 2015/0115018 A1* | 4/2015 | Hori | H01B 1/22 228/104 |
| 2017/0018325 A1 | 1/2017 | Theunissen et al. | |

FOREIGN PATENT DOCUMENTS

| | | |
|---|---|---|
| CN | 103778993 A | 5/2014 |
| CN | 103827981 A | 5/2014 |
| CN | 104751942 A | 7/2015 |
| DE | 102012210615 A1 | 12/2013 |
| EP | 2787511 A1 | 10/2014 |
| JP | 4-183770 A | 6/1992 |
| JP | 2010109334 A | 5/2010 |
| JP | 2014084249 A | 5/2014 |
| JP | 2015-122506 A | 7/2015 |

OTHER PUBLICATIONS

De Wolf, S.; Descoeudres, A.; Holman, Z.C. and Ballif, C. "High-efficiency Silicon Heterojunction Solar Cells: A Review." Green, vol. 2 (2012), pp. 7-24.

* cited by examiner

SINTERABLE COMPOSITION FOR USE IN SOLAR PHOTOVOLTAIC CELLS

TECHNICAL FIELD OF THE INVENTION

The present invention relates to a conductive paste composition for solar photovoltaic cells comprising: metal particles dispersed in a suitable carrier therefor, wherein said carrier comprises a solvent and a resin, and wherein at least a portion of said metal particles are characterized by: having a ψ value, as defined by X-ray diffraction<0.0020; having at least 50% degree of crystallinity; and being anisotropic with respect to crystallographic direction. The present invention also relates to the use of the conductive paste composition according present invention in a solar photovoltaic cells as a finger electrode material.

BACKGROUND OF THE INVENTION

Silicon heterojunction solar cells (1) consist of thin amorphous silicon layers deposited on crystalline silicon wafers. The design enables over 20% energy conversion efficiencies. The key is that the metal contacts, made from busbars (2) and fingers (3), which are both printed on the silicon wafer are electronically separated from the absorber by insertion of a wider bandgap layer. These metallic top contacts are necessary to collect the current generated by a solar cell. This general structure is illustrated in FIGS. 1A and 1B (1A illustrates basic configuration with three busbars and 1B illustrates basic configuration with four busbars).

Fingers are linear areas of metallization that collect current to deliver it to the busbars, which are connected directly to the external leads. Traditionally, the busbars and fingers have been made from the same material by either using a single print or a dual print process. However, using different materials is also possible in a dual printing process. In the dual printing method both materials can be optimized to have best overall performance, and an optimized cost structure. The finger electrode can be optimized to have ideal fine line print performance with a narrow print width to have as little shadowing as possible, and in addition, optimized to have ideal conductivity and contact resistance to the underlying substrate. The busbar electrode can be optimized towards the adhesion for the interconnection of different cells into a solar module.

Numerous patents are based on thermoplastic as well as thermoset approaches to create conductive pastes for the solar cells. Thermoplastic pastes have higher amounts of solvent, and control of the curing temperature prevents solvent entrapment in the bonding area. For these pastes, heating initiates polymerisation and helps long polymer chains to move freely, while cooling reduces their motion. On the other hand, thermoset pastes behave differently. During polymerisation, thermoset polymers form chemical bonds between adjacent chains; the result is a three-dimensional network that is much more rigid that the two-dimensional network (linear) thermoplastic structure.

Fabricating narrow and long metal lines helps reduce resistive and shadow losses at the front of silicon heterojunction solar cells. Shadow losses are caused by the presence of metal on the top surface of the solar cell, which prevents light from entering the solar cell. The shading losses are determined by the transparency of the top surface, which, for a planar top surface, is defined as the fraction of the top surface covered by the metal. The transparency is determined by the width of the metal lines on the surface and on the spacing of the metal lines. An important practical limitation is the minimum linewidth associated with a particular metallization technology. For identical transparencies, a narrow line-width technology can have closer finger spacing, thus reducing the emitter resistance losses.

Screen-printing is popular method of metallization in crystalline silicon photovoltaic. Crystalline silicon photovoltaics are modules built using crystalline silicon solar cells (c-Si). Typical conductor lines have line width of 70-100 μm which are achieved in production for silicon heterojunction solar cells using low temperature pastes and using a single print process. The printed contacts of silicon heterojunction solar cells are typically cured at temperatures around 200° C.

Stencil printing is another metallization method, which can produce lines with width of 35 μm for a 25 μm stencil opening. This is narrow line width compared to the typical conductor line widths 45-55 μm in single printing process or 45-55 μm dual printing process for standard silicon homojunction solar cells using high firing pastes. This is clearly illustrating that the low temperature firing pastes require improvement in order to enable the printing with narrower line widths.

The line resistance of the printed finger electrodes is of high importance in the creation of high efficient heterojunction silicon solar cells. As this type of solar cells are temperature sensitive, high firing pastes, typically used for standard c-Si cell production cannot be used as metallization pastes in the cell manufacturing. This limits their electrical conductivity.

Best currently available low-temperature silver pastes reach resistivity down to 8 μohm.cm, which is still higher than that of standard high temperature pastes. In order to overcome the losses related to the lower line resistance because of the lower bulk conductivity, cell producers are either increasing the number of busbars or going to other interconnection methods such as using a multi-wire array where wires are used instead of busbars.

Therefore, there is still a need for conductive pastes, which can reach lower resistivity and good fine line print performance in order to achieve a cell efficiency gain.

SUMMARY OF THE INVENTION

The present invention relates to a conductive paste composition for solar photovoltaic cells comprising: metal particles dispersed in a suitable carrier therefor, wherein said carrier comprises a solvent and a resin, and wherein at least a portion of said metal particles are characterized by: having a ψ value, as defined by X-ray diffraction<0.0020; having at least 50% degree of crystallinity; and being anisotropic with respect to crystallographic direction.

The present invention relates to use of the conductive paste composition according to the present invention in a solar photovoltaic cells as a finger electrode and/or busbar material.

The present invention also encompasses a process of preparing a conductive network on solar photovoltaic cells, wherein said comprises steps of: a) applying a conductive paste composition according to the present invention to a silicon substrate and/or a transparent conductive oxide (TCO), and b) drying and curing.

DETAILED DESCRIPTION OF THE INVENTION

Figure 1A:
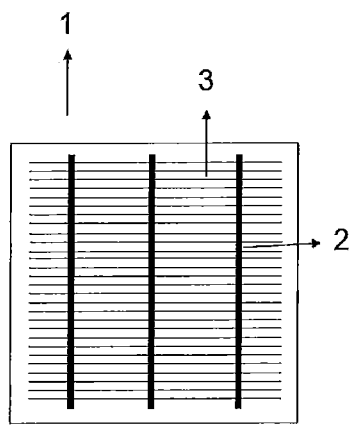
FIG. 1A illustrates basic configuration with three bushbars.
Figure 1B:
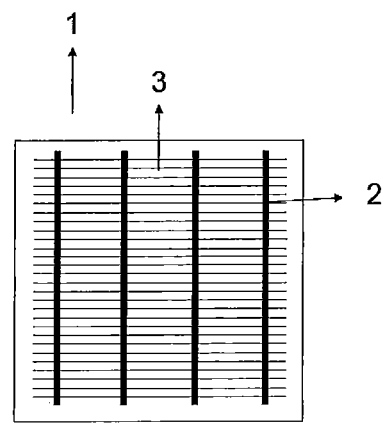
FIG. 1B illustrates basic configuration with four busbars.

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps.

The recitation of numerical end points includes all numbers and fractions subsumed within the respective ranges, as well as the recited end points.

All percentages, parts, proportions and then like mentioned herein are based on weight unless otherwise indicated.

When an amount, a concentration or other values or parameters is/are expressed in form of a range, a preferable range, or a preferable upper limit value and a preferable lower limit value, it should be understood as that any ranges obtained by combining any upper limit or preferable value with any lower limit or preferable value are specifically disclosed, without considering whether the obtained ranges are clearly mentioned in the context.

All references cited in the present specification are hereby incorporated by reference in their entirety.

Unless otherwise defined, all terms used in disclosing the invention, including technical and scientific terms, have the meaning as commonly understood by one of the ordinary skill in the art to which this invention belongs to. By means of further guidance, term definitions are included to better appreciate the teaching of the present invention.

In accordance with the present invention, there are provided a conductive paste composition for solar photovoltaic cells comprising: metal particles dispersed in a suitable carrier therefor,
wherein said carrier comprises a solvent and a resin, and wherein at least a portion of said metal particles are characterized by: having a $\psi$ value, as defined by X-ray diffraction<0.0020; having at least 50% degree of crystallinity; and being anisotropic with respect to crystallographic direction.

A conductive paste composition for solar photovoltaic cells according to the present invention comprises metal particles, preferably metal particles are sinterable metal particles.

Suitable metal particles for use in the present invention are selected from the group consisting of Ag, Cu, Au, Pd, Ni, In, Sn, Zn, Li, Mg, Al, Mo, and the mixtures thereof. Preferably, metal particles are silver particles, more preferably sinterable silver particles.

Suitable metal particles for use in the present invention include also silver coated/plated particulate, wherein the underlying particulate can be any of a variety of materials, so long as the silver coating/plating substantially coats the underlying particulate, such that the resulting composition comprises a thermoplastic matrix having silver-covered particles distributed throughout.

Silver particles are preferred because of the conductivity of silver and because silver-oxides are also conductive (gold-oxides are also conductive, however, due to their high price they do not provide economical solution). Moreover, silver particles are preferred because the temperature upon which silver—with particle size suitable for the application—can sinter is acceptable for the application (<200° C.).

At least portion of suitable metal particles for use in the present invention have a $\psi$ value<0.0020, as defined by X-ray diffraction.

The $\psi$ value is employed herein to express the broadening of the diffraction peak (which is due to contribution from both the instrument and the specimen). For purposes of this application, "Specimen Broadening" is separated from "Instrument Broadening".

The customarily used term for the function that describes the shape of the diffraction peak is the Profile Shape Function (PSF). For purposes of the present disclosure, it was elected to use the Lorentzian function herein to fit the peaks.

Thus, determination of the "psi" parameter from the raw data is carried out by first obtaining raw X-ray diffraction data for exemplary material. Then peak widths are obtained for all samples.

To simplify sample characterization, one can define a "psi" parameter, as a peak width divided by its peak position (so the value is dimensionless). One can then calculate the average of "psi" for each peak and arrive at a final average value.

Note that the "psi" for each sample still represents the contribution from both the Instrument Broadening and the Specimen Broadening. The contribution to the "psi" from the instrument, which is a constant, is obtained from the analysis of the reference NAC crystals on the same instrument as the rest of the samples.

Next the total "psi" factor and the "psi"-star (which represents the broadening of the diffraction peaks due to the specimen only) are compared. A threshold of 0.002 separates the well-performing samples from poorly-performing ones.

At least portion of the metal particles for use in the present invention have at least 50% degree of crystallinity. High crystallinity is preferred because it provides high electrical conductivity.

In some embodiments, suitable metal particles have at least 60% degree of crystallinity, preferably suitable metal particles have at least 70% degree of crystallinity, more preferably suitable metal particles 80% degree of crystallinity, more preferably suitable metal particles have at least 90% degree of crystallinity, more preferably suitable metal particles have at least 95% degree of crystallinity, even more preferably suitable metal particles have at least 98% degree of crystallinity and even more preferably suitable metal particles have at least 99% degree of crystallinity. In highly preferred embodiments, suitable metal particles have substantially 100% degree of crystallinity.

Quantification of crystallinity can be performed using a Rietveld refinement method of X-ray diffraction data of a specimen, in which the sample to be studied is mixed with a 100% crystalline compound in a known relation. For the purposes of this invention, a defined amount of silver samples were mixed with fully crystalline $SiO_2$ (the weight relation for both is near to 1:1). Then the X-ray diffraction pattern was measured and Rietveld analysis was performed according to methods known to those skilled in the art. From the known amount of silver and $SiO_2$, and the obtained silver weight fraction, the amount (and fraction) of crystalline silver was obtained. Other variations of the Rietveld refinement method, as well as different methods of determining crystalline fraction can also be used to obtain the degree of crystallinity used for the purpose of this invention.

As used herein, crystal anisotropy refers to the variation of physical or chemical properties of crystalline material in directions related to principal axis (or crystalline planes) of its crystal lattice. Numerous methods are available for determining anisotropy of crystals, including, for example, optical, magnetic, electrical or X-ray diffraction methods. One of the latter methods of differentiation of crystal anisotropy of silvers in particular, is referred to by Yugang Sun & Younan Xia, Science, Vol. 298, 2002, pp. 2176-79:

> It is worth noting that the ratio between the intensities of the (200) and (111) diffraction peaks was higher than the conventional value (0.67 versus 0.4), indicating that our nanocubes were abundant in {100} facets, and thus their {100} planes tended to be preferentially oriented (or textured) parallel to the surface of the supporting substrate (26). The ratio between the intensities of the (220) and (111) peaks was also slightly higher than the conventional value (0.33 versus 0.25) because of the relative abundance of {110} facets on the surfaces of our silver nanocubes.

At least a portion of the metal particles suitable for use in the present invention are anisotropic with respect to crystallographic direction, preferably at least a portion of said metal particles suitable for use in the present invention have a high anisotrophy. High anisotropy is preferred because this will provide better sinter capability, and as such a better electrical conductivity. Preferably, the ratio of peak intensity of diffraction peak 200 and peak intensity of diffraction peak 111 is above 0.5. By the diffraction peak is meant the diffraction peak of the metal particles.

In order to realize the benefits imparted by the present invention, it is only necessary that a portion of the metal particles used herein satisfy the plurality of criteria set forth herein. Thus, in some embodiments, at least 5% of the metal particles employed will meet each of the criteria set forth herein. More specifically, at least 5% of said metal particles are characterized by having a ψ value, as defined by X-ray diffraction<0.0020, having at least 50% degree of crystallinity and being anisotropic with respect to crystallographic direction.

In some embodiments, at least 10% of the metal particles employed will meet each of the criteria set forth herein. In some embodiments, at least 20% of the metal particles employed will meet each of the criteria set forth herein. In some embodiments, at least 30% of the metal particles employed will meet each of the criteria set forth herein. In some embodiments, at least 40% of the metal particles employed will meet each of the criteria set forth herein. In some embodiments, at least 50% of the metal particles employed will meet each of the criteria set forth herein. In some embodiments, at least 60% of the metal particles employed will meet each of the criteria set forth herein. In some embodiments, at least 70% of the metal particles employed will meet each of the criteria set forth herein. In some embodiments, at least 80% of the metal particles employed will meet each of the criteria set forth herein. In some embodiments, at least 90% of the metal particles employed will meet each of the criteria set forth herein. In some embodiments, at least 95% of the metal particles employed will meet each of the criteria set forth herein. In some embodiments, at least 98% of the metal particles employed will meet each of the criteria set forth herein. In some embodiments, substantially all of the metal particles employed will meet each of the criteria set forth herein.

On the technical point of view it is preferred that as high percentage as possible of the metal particles employed will meet each of the criteria set forth herein.

Suitable metal particles for use in the present invention typically have an average particle size in the range of from 300 nm to 12 micron, preferably from 500 nm to 7 micron.

The particle size is measured by particle size analyser and the particle shape is analysed by scanning electron microscope. In short scattered laser lights from the particles are detected an array of detectors. Theoretical calculation is carried out to fit the measured distribution of scattered light intensity. During the fitting process the particle size distribution is deduced and D10, D50, D90 etc. values are calculated accordingly.

These particle size ranges are preferred, because they enable to print very narrow lines.

In some embodiments, suitable metal particles are a mixture of metal particles, which meet each of the criteria set forth herein ("first metal particles") and "second metal particles" having a different criteria as set forth below.

Suitable second metal particles are preferably sinterable metal particles. Suitable second metal particles for use in the present invention are selected from the group consisting of Ag, Cu, Au, Pd, Ni, In, Sn, Zn, Li, Mg, Al, Mo, and the mixtures thereof. Preferably, second metal particles are silver particles, more preferably sinterable silver particles.

Preferably, suitable second metal particles for use in the present invention have an average particle size of 2 μm to 40 μm, and more preferably of 2 μm to 20 μm, and more preferably from 2 μm to 10 μm.

It is also preferred that second metal particles have a tap density from 1.5 $g/cm^3$ to 6.0 $g/cm^3$, preferably from 3.5 $g/cm^3$ to 5.5 $g/cm^3$.

It is also preferred that second metal particles have surface area between 0.4-2.1 $m^2/g$.

It is also preferred that second metal particles have a weight loss at 538° C. in the range from 0.1 to 3%, preferably in the range from 0.2 to 0.8%. Wherein weight loss is measured by performing thermal gravimetric analysis (TGA), by using TGA Q 500 TA instruments equipment and running ramp from 0 to 700 degrees Celsius, 10 degrees/min, and at 538 degrees Celsius, the amount of weight loss in percentage (%) is reported.

And furthermore, it is preferred that second metal particles have D50 between 0.9-2.1 micron. Particle size is measured according to the method described above.

The tap density is determined in accordance to ISO 3953 typically using a 25 $cm^3$ graduated glass cylinder. The principle of the method specified is tapping a specified amount of powder in a container by means of a tapping apparatus until no further decrease in the volume of the powder takes place. The mass of the powder divided by its volume after the test gives its tap density.

Suitable second metal particles, may be one kind of metal particles, meeting one or more criteria set above, or alternatively, the second metal particles may be mixture of two more different metal particles, both particles meeting one or more criteria above. Preferably, second metal particles meet all criteria set above.

Suitable commercially available second metal particles for use in the present invention are for example P698-1 and P554-16 from Metalor.

Thus, in some embodiments, about 5% of the metal particles employed are first metal particles and will meet each of the criteria set forth herein, and about 95% of the metal particles employed are second metal particles as described above. More specifically, about 5% of said metal particles are first metal particles and are characterized by having a ψ value, as defined by X-ray diffraction<0.0020, having at least 50% degree of crystallinity and being anisotropic with respect to crystallographic direction, and about 95% of the metal particles are second metal particles and are characterized by having an average particle size of 2 μm to 40 μm and/or a tap density from 1.5 g/cm$^3$ to 6.0 g/cm$^3$ and/or surface area between 0.4-2.1 m$^2$/g, and weight loss at at 538° C. in the range from 0.1 to 3%.

In some embodiments, about 10% of the metal particles employed are first metal particles and will meet each of the criteria set forth herein, and about 90% of the metal particles employed are second metal particles as described above. In some embodiments, about 20% of the metal particles employed are first metal particles and will meet each of the criteria set forth herein, and about 80% of the metal particles employed are second metal particles as described above. In some embodiments, about 30% of the metal particles employed are first metal particles and will meet each of the criteria set forth herein, and about 70% of the metal particles employed are second metal particles as described above. In some embodiments, about 40% of the metal particles employed are first metal particles and will meet each of the criteria set forth herein, and about 60% of the metal particles employed are second metal particles as described above. In some embodiments, about 50% of the metal particles employed are first metal particles and will meet each of the criteria set forth herein, and about 50% of the metal particles employed are second metal particles as described above. In some embodiments, about 60% of the metal particles employed are first metal particles and will meet each of the criteria set forth herein, and about 40% of the metal particles employed are second metal particles as described above. In some embodiments, about 70% of the metal particles employed are first metal particles and will meet each of the criteria set forth herein, and about 30% of the metal particles employed are second metal particles as described above. In some embodiments, about 80% of the metal particles employed are first metal particles and will meet each of the criteria set forth herein, and about 20% of the metal particles employed are second metal particles as described above. In some embodiments, about 90% of the metal particles employed are first metal particles and will meet each of the criteria set forth herein, and about 10% of the metal particles employed are second metal particles as described above. In some embodiments, about 95% of the metal particles employed are first metal particles and will meet each of the criteria set forth herein, and about 5% of the metal particles employed are second metal particles as described above. In some embodiments, about 98% of the metal particles employed are first metal particles and will meet each of the criteria set forth herein, and about 2% of the metal particles employed are second metal particles as described above.

Suitable metal particles (including first and second metal particles) for use in the present invention can exist in a variety of shapes, e.g., as substantially spherical particles, as irregular shaped particles, oblong particles, flakes (e.g., thin, flat, single crystal flakes), and the like. Shape of the first and second metal particles, if both are present can be the same or different.

The conductive paste composition for solar photovoltaic cells according to the present invention comprises metal particles from 20 to 98% by weight by total weight of the composition, preferably from 50 to 95% and more preferably from 75 to 92%.

The quantity range include first metal particles and second metal particles (if present).

This metal particle quantity provides ideal conductivity. Therefore, if composition comprises less than 20% of metal particles, composition is no longer conductive. However, composition, cannot comprise more than 98% of metal particles, higher quantity of metal particles cannot be fine line printed. The printing process requires specific rheology, and therefore pure metal particles cannot printed in their own.

A conductive paste composition for solar photovoltaic cells according to the present invention comprises a carrier. A suitable carrier for use in the present invention comprises a solvent and a resin.

Suitable solvent for use in the present invention is selected from the group consisting of an alcohol, an aromatic hydrocarbon, a saturated hydrocarbon, a chlorinated hydrocarbon, an ether, a polyol, an ester, a dibasic ester, kerosene, high boiling alcohols and esters thereof, glycol ethers, ketones, amides, heteroaromatic compounds, and mixtures thereof, preferably solvent is selected from the group consisting of dibasic esters, acetates and mixtures thereof.

More preferably, said solvent is selected from the group consisting of dipropylene glycol, ethylene glycol, diethylene glycol, triethylene glycol, hexylene glycol, 1-methoxy-2-propanol, diacetone alcohol, tert-butyl alcohol, 2-ethyl-1,3-hexanediol, tridecanol, 1,2-octanediol, butyldiglycol, alpha-terpineol or beta-terpineol, 2-(2-butoxyethoxy)ethyl acetate, 2,2,4-trimetyl-1,3-pentanediol diisobutyrate, 1,2-propylene carbonate, carbitol acetate, butyl carbitol acetate, butyl carbitol, ethyl carbitol acetate, 2-phenoxy ethanol, hexylene glycol, dibutylphthalate, dibasic ester, dibasic ester 9, dibasic ester 7, and mixtures thereof, preferably said solvent is selected from the group consisting of carbitol acetate, butyl carbitol acetate, and dibasic ester, dibasic ester 9, dibasic ester 7, and mixtures thereof.

Above listed preferred solvents are preferred, because they are high boiling solvents, and may guarantee the print performance required for the present invention.

The conductive paste composition for solar photovoltaic cells according to the present invention comprises a solvent from 1 to 30% by weight by total weight of the composition, preferably from 1.5 to 20% and more preferably from 2 to 10%.

If the composition according to the present invention comprises too much solvent, the printing height cannot be obtained, and as such, the line resistance required for the application cannot be met. On the other hand, if the composition comprises less than 1% solvent, it is unlikely to dissolve the resin (in case of thermoplastic) and have high solids content (in case of thermoplastic and thermoset or hybrid).

Suitable resin for use in the present invention is selected from the group consisting of cellulose based resins, polyester resins, phenoxy resins, polyurethane resins, halogenated resins selected from the group consisting of homopolymers of vinylidene chloride and copolymers of vinylidene chloride and acrylnitrile, polymethacrylate resins, polyacrylate resins thermoset resins selected from the group consisting of epoxy resins, acrylate resins, bismaleimide resins, cyanate ester resins, silicone resins and oxetane functionalised resins and mixtures thereof. Preferably, resin is cellulose based resin.

Suitable commercially available cellulose based resins for use in the present invention are for example Ethocel 10, 100 and 300 supplied by The Dow Chemical company or CAB 381-2, 381-20, 398-3, 551-01 supplied by Eastman or ECN 4, 10, 22 supplied by Ashland.

Suitable commercially available polyester resins for use in the present invention are for example Vitel 2200B, 2700B, 3300B all supplied by Bostik.

Suitable commercially available phenoxy resins for use in the present invention are for example PKHJ, PKHC, PKHB and PKHH supplied by Inchem.

Suitable commercially available phenolic resin for use in the present invention are for example PF9132KP, PF9640LG, PF6535LB and PF6806LB all supplied by Momentive and HF, 1 m, HF-3M, HF-4M all supplied by Meiwa Chemical.

Suitable commercially available polyurethane resins for use in the present invention are for example Estane 5703, 5707, 5708, 5712, 5713, 5715, 5719, and 5778 supplied by Lubrizol.

Suitable commercially available halogenated resin is for example PVDC resin F3100 supplied by Asahi Kasei Chemicals.

Suitable thermoset resin for use in the present invention is selected from the group consisting of epoxy resins, acrylate resins, bismaleimide resins, cyanate ester resins, silicone resins and oxetane functionalised resins and mixtures thereof. Preferably thermoset resin is epoxy resin.

The conductive paste composition for solar photovoltaic cells according present invention comprises a resin from 0.1 to 10% by weight by total weight of the composition, preferably from 0.5 to 8% and more preferably from 1 to 6%.

If composition according to the present invention comprises less than 0.1% of resin, no adhesion will be obtained on the other hand if composition comprises more than 10% of resin, conductivity of the composition is negatively affected.

The conductive paste composition for solar photovoltaic cells according present invention may further comprise a curing agent.

Suitable curing agent for use in the present invention may be for example peroxide or azo compounds for acrylic thermoset systems, latent curing agents: imidazoles, epoxy imidazole adducts, epoxy amine adducts, and urea or cationic initiators such as Rhodorsil 2074 may be used for epoxy thermoset systems.

The conductive paste composition for solar photovoltaic cells according present invention may further comprise one or more additives selected from the group consisting of rheological additives, wetting agents and dispersing agents.

A conductive paste composition according to the present invention can be used in solar photovoltaic cells as a finger electrode material and/or busbar material.

Figure 2:
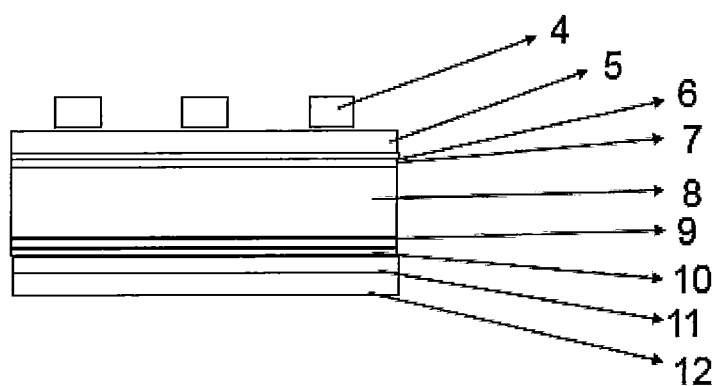
FIG. 2 illustrates schematic presentation of heterojunction cell.

More specifically, the composition according to the present invention can be used in the heterojunction cells. Schematic structure of heterojunction cells is illustrated in FIG. 2 (not drawn in scale). 4 represents fine line fingers, which are prepared from the composition according to the present invention. 5 represents a transparent conductive oxide (TCO) layer. 6 represents ($p^+$) a-Si:H layer. 7 represents n-type c-Si layer. 8 represents a-Si/H layer. 9 represents ($n^+$) a-Si:H layer. 10 represents a TCO layer. And 11 represents a rear electrode, which can be prepared from the composition according to the present invention or different conductive paste.

Typically, the collector electrodes consist of a finger electrode and a bus bar electrode. In one embodiment, the finger electrode material and the busbar material are produced from the same material. Design of front and back may vary for example for bifacial cell more fingers or wider fingers can be used on the back or for monofacial cells no fingers may be used. The bus bar electrode then serves to make the interconnection between adjacent cells, typically by using a metal ribbon linking the top of one cell to the back of the other cell. This interconnection can be done for example by a soldering process or by using a conductive adhesive or by using a conductive film. If such design is used the material used for the finger and the busbar may be the same material and can be applied by a single printing or by a dual printing process. The dual printing process is typically done in order to increase the height of the print, and therefore, to decrease the line resistance.

In another embodiment, the finger electrode material and the busbar material are different materials, and in this case, a dual printing process needs to be used. Both materials can be optimized to have ideal overall performance and cost advantage in the dual printing process. The finger electrode can be optimized to have ideal fine line print performance with a narrow print width to have as little as shadowing possible. In addition optimized to have ideal conductivity and contact resistance to the underlying substrate. In this embodiment, the finger material is adhesive paste according to the present invention and the busbar electrode can be optimized towards the adhesion for the interconnection of different cells into a solar module. In this embodiment, the busbar can be formed from a standard commercially available conductive paste.

Preferably, the height of the fine lines printed from the adhesive composition according to the present invention is about 20 µm.

Preferably, the width of the lines printed from the adhesive composition according to the present invention is about 70 µm, preferably about 50 µm and more preferably about 30 µm.

Preferably, the aspect ratio of fine lines printed from the adhesive composition according to the present invention is greater than 0.3. Aspect ratio greater than 0.3 is preferred, as it enables to improve electrical performance or the material in final product.

Figure 3:
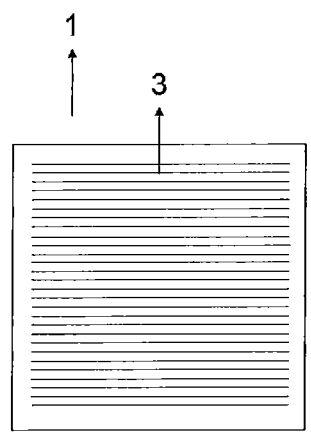
FIG. 3 illustrates a solar cell structure without busbars.

However, the present invention is not limited to solar cells with a busbar design, but relates also to solar cells (1) without busbars, which only have printed fingers (3) on the cell. This is illustrated in FIG. 3. These cells can be interconnected with conductive adhesive/film serving as busbar or which can for example be used in a module using a multi-wire array where wires are used in the place of busbars.

The present invention is not limited to electrodes for front contact solar cells but also back contact solar cells having the same need for low contact resistivity (CR), high conductive low temperature benefit from this. Therefore, a conductive paste composition according to the present invention can be used as a surface finger electrode material and/or a rear finger electrode material.

The present invention also covers a process of preparing a conductive network on solar photovoltaic cells, wherein said comprises steps of:
  a) applying a conductive paste composition according to the present invention to a silicon substrate and/or a transparent conductive oxide (TCO), and
  b) drying and curing.

In one embodiment, the process of preparing a conductive network on solar photovoltaic cells further comprises a step c) applying a busbar.

In one embodiment the process of preparing a conductive network on solar photovoltaic cells further comprises a step c) applying a busbar, wherein said busbar is formed from the conductive paste according to the present invention.

In another embodiment the process of preparing a conductive network on solar photovoltaic cells further comprises a step c) applying a busbar, wherein said busbar is formed from any other conductive ink formulation with optimized performance in terms of cost or in terms of adhesion. This is possible in applications, wherein high conductivity or fine line printability is not required from the bus bar material.

In one embodiment, said conductive paste composition is applied by method selected from the group consisting of screen-printing, stencil printing, gravure printing, offset printing and ink jet printing, preferably by screen-printing.

Screen-printing is preferred because it is technically best way to achieve the targets on fine line printing. In addition it is preferred because of its cost (stencil printing is more expensive for same number of cells).

Examples

Composition comprising a cellulose resin was prepared by dissolving resin to solvent by using propeller mixer and subsequently, silver particles were added to resin/solvent masterbatch and mixed until mixture was homogeneous (mixing was done by using speedmixer or propeller mixer).

Composition comprising a thermoset resin was prepared by mixing resin and latent hardener by using speedmixer or propeller mixer and subsequently, silver particles were added to the mixture and mixed until mixture was homogeneous (mixing was done by using speedmixer or propeller mixer).

Printing process for dual printing approach bi-facial cell:

Fingers were printed first onto the backside of the cell, and dried. Subsequently, busbars were printed onto the backside and dried. The cell was flipped. Fingers were printed onto the front side of the cell, and dried. Subsequently, busbars were printed onto the front side of the cell and dried. Finally, the cell was fully cured and/or dried.

Printing process for single printing approach bi-facial cell:

Fingers and busbars were printed first onto the backside of the cell, and dried. The cell was flipped. Subsequently, fingers and busbars were printed onto the front side of the cell. Finally the cell was fully cured and/or dried.

Table 1 lists all components used in the example compositions. Values are weight %.

TABLE 1

| | Example 1 | Example 2 | Example 3 | Example 4 | Example 5 | Example 6 | Example 7 |
|---|---|---|---|---|---|---|---|
| First metal particles Silver particles having $\psi$ value 0.010 Crystallinity 82% Intensity of peak 200/intensity of peak 111 0.48 | 93.53 | 90.02 | 10.00 | 10.00 | 10.00 | 86.97 | |
| First metal particles comparative example DF AT 2017 from DOWA | | | | | | | 87.56 |
| Second metal particles K554-13 Silver particles from Metalor | | | 80.00 | 80.00 | 80.00 | | |
| Solvent Carbitol acetate from Kluthe Benelux BV | 3.85 | | | 4.46 | 4.46 | | |
| Solvent DBE-9 from Invista | | 6.98 | 6.72 | | | 10.13 | 6.12 |
| Polyester resin Vitel 3300B from Bostik | | | 3.28 | | | | |
| Cellulose resin CAB 381-2 from Eastman | 2.62 | | | | | | |

TABLE 1-continued

|  | Example 1 | Example 2 | Example 3 | Example 4 | Example 5 | Example 6 | Example 7 |
|---|---|---|---|---|---|---|---|
| Cellulose resin CAB 381-20 from Eastman |  | 2.99 |  |  |  |  |  |
| Cellulose resin ECN 22 from Ashland |  |  |  |  |  | 2.89 | 2.81 |
| Epalloy 5200 from CVC Thermoset Specialties |  |  |  | 5.5 |  |  |  |
| Bisphenol A epoxy resin from CVC Thermoset Specialties |  |  |  |  | 5.5 |  |  |
| Rhodorsil 2074 |  |  |  |  |  | 0.04 | 0.04 |

Table 2 summaries data collected from the examples 1-3.

TABLE 2

|  | Example 1 | Example 2 | Example 3 | Example 4 | Example 5 | Example 6 | Example 7 |
|---|---|---|---|---|---|---|---|
| VR Ohm.cm | 4.7E−06 | 7.2E−06 | 7.2E−06 | 8.1E−06 | 7.5E−06 | 3.8E−06 | 7.6E−06 |
| Viscosity 10 s−1 (Pa · s) | 164.7 | 117.0 | 234.6 | 101.7 | 80.5 | 119.1 | 652.0 |
| Viscosity 100 s−1 (Pa · s) | 29.4 | 31.88 | 80.76 | 35.6 | 20.4 | 42.2 | 89.03 |

Viscosity has been measured according to Rheometer measurement using 2 cm plate, 200 micron gap and shear rates as indicated above: 10 s−1 or 100 s−1.

Volume resistivity (VR) was measured as follows:

Samples were prepared for the compositions according to the examples above on the glass plates and cured and dried (according to the requirement for the used resin). Glass plates were cooled to the room temperature, before measurement.

Volume resistivity (VR) was measured by using Keithley 4 point probes and multimeter and 4 point probe resistance measurement.

Volume resistivity was calculated from equation VR= (width of the sample (cm)×thickness of the sample (cm)× Resitance (Ohm))/length of the sample (cm).

The invention claimed is:

1. A conductive paste composition for solar photovoltaic cells comprising:
   metal particles dispersed in a suitable carrier therefor,
      wherein said carrier comprises a solvent and a resin, and
      wherein at least a portion of said metal particles are characterized by:
         having a ψ value, as defined by X-ray diffraction, <0.0020,
         having from 50% degree of crystallinity to 90% degree of crystallinity, and
         being anisotropic with respect to crystallographic direction.

2. The conductive paste composition for solar photovoltaic cells according to claim 1, wherein said metal particles are selected from Ag, Cu, Au, Pd, Ni, In, Sn, Zn, Li, Mg, Al or Mo.

3. The conductive paste composition for solar photovoltaic cells according to claim 1, wherein at least 5% of said metal particles are characterized by:
   having a ψ value, as defined by X-ray diffraction, <0.0020,
   having at least 50% degree of crystallinity, and
   being anisotropic with respect to crystallographic direction.

4. The conductive paste composition for solar photovoltaic cells according to claim 1, wherein said solvent is selected from the group consisting of an alcohol, an aromatic hydrocarbon, a saturated hydrocarbon, a chlorinated hydrocarbon, an ether, a polyol, an ester, a dibasic ester, kerosene, high boiling alcohols and esters thereof, glycol ethers, ketones, amides, heteroaromatic compounds, and mixtures thereof.

5. The conductive paste composition for solar photovoltaic cells according claim 4, wherein said solvent is selected from the group consisting of dipropylene glycol, ethylene glycol, diethylene glycol, triethylene glycol, hexylene glycol, 1-methoxy-2-propanol, diacetone alcohol, tert-butyl alcohol, 2-ethyl-1,3-hexanediol, tridecanol, 1,2-octanediol, butyldiglycol, alpha-terpineol or beta-terpineol, 2-(2-butoxyethoxy)ethyl acetate, 2,2,4-trimetyl-1,3-pentanediol diisobutyrate, 1,2-propylene carbonate, carbitol acetate, butyl carbitol acetate, butyl carbitol, 2-phenoxy ethanol, ethyl carbitol acetate, hexylene glycol, or dibutylphthalate, gamma-butyrolactones, dibasic ester, dibasic ester 9, dibasic ester 7, and mixtures thereof.

6. The conductive paste composition for solar photovoltaic cells according to claim 1, wherein said resin is selected from the group consisting of cellulose based resins, polyester resins, phenoxy resins, polyurethane resins, halogenated resins selected from the group consisting of homopolymers of vinylidene chloride and copolymers of vinylidene chloride and acrylonitrile, polymethacrylate resins, polyacrylate resins, thermoset resins selected from the group consisting of epoxy resins, acrylate resins, bismaleimide resins, cyanate ester resins, silicone resins and oxetane functionalised resins and mixtures thereof.

7. The conductive paste composition for solar photovoltaic cells according to claim 1, wherein said metal particles are present in the composition from 20 to 98% by weight by total weight of the composition.

8. The conductive paste composition for solar photovoltaic cells according to claim 1, wherein said resin is present in the composition from 0.1 to 10% by weight by total weight of the composition.

9. The conductive paste composition for solar photovoltaic cells according to claim 1, wherein said solvent is present in the composition from 1 to 30% by weight by total weight of the composition.

10. The conductive paste composition for solar photovoltaic cells according to claim 1, wherein said composition further comprises a curing agent.

11. The conductive paste composition for solar photovoltaic cells according to claim 1, further comprising second metal particles selected from the group consisting of Ag, Cu, Au, Pd, Ni, In, Sn, Zn, Li, Mg, Al, Mo, and mixtures thereof.

12. The conductive paste composition for solar photovoltaic cells according to claim 11, wherein the second metal particles have an average particle size of 2 μm to 40 μm.

13. The conductive paste composition for solar photovoltaic cells according to claim 11, wherein the second metal particles have a tap density from 1.5 g/cm$^3$ to 6.0 g/cm$^3$.

14. The conductive paste composition for solar photovoltaic cells according to claim 11, wherein the second metal particles have a surface area between 0.4 to 2.1 m$^2$/g.

15. The conductive paste composition for solar photovoltaic cells according to claim 11, wherein the second metal particles have D50 from 0.9 to 2.1 micron.

16. The conductive paste composition for solar photovoltaic cells according to claim 11, wherein the second metal particles have an average particle size of 2 μm to 40 μm, a tap density from 1.5 g/cm$^3$ to 6.0 g/cm$^3$, a surface area between 0.4 to 2.1 m$^2$/g, and D50 from 0.9 to 2.1 micron.

\* \* \* \* \*